United States Patent

Kashiwagi et al.

[11] Patent Number: 5,405,652
[45] Date of Patent: Apr. 11, 1995

[54] METHOD OF MANUFACTURING A DIE FOR USE IN MOLDING GLASS OPTICAL ELEMENTS HAVING A FINE PATTERN OF CONCAVITIES AND CONVEXITIES

[75] Inventors: Yoshinari Kashiwagi, Neyagawa; Makoto Umetani, Izumi; Masaki Aoki, Minoh, all of Japan

[73] Assignee: Matsushita Electric Industrial Co., Ltd., Osaka, Japan

[21] Appl. No.: 89,520

[22] Filed: Jul. 21, 1993

[30] Foreign Application Priority Data

Jul. 21, 1992 [JP] Japan .................. 4-193737

[51] Int. Cl.$^6$ .......................... B05D 1/32; C23C 14/04
[52] U.S. Cl. .................. 427/282; 204/298.11
[58] Field of Search .......... 427/250, 282; 264/1.3; 204/192.16, 298.11; 65/64

[56] References Cited

U.S. PATENT DOCUMENTS 4,842,633  6/1989  Kuribayashi et al. ................ 65/44
5,171,348  12/1992  Umetani et al. ................ 65/374.11

FOREIGN PATENT DOCUMENTS 62-203101  9/1987  Japan .
62-292637  12/1987  Japan .
1-111733   4/1989  Japan .
2-157129   6/1990  Japan .
2-199402   8/1990  Japan .
4-170502   6/1992  Japan .

Primary Examiner—Terry J. Owens
Attorney, Agent, or Firm—Wenderoth, Lind & Ponack

[57] ABSTRACT

A method of manufacturing glass optical elements such as gratings, microlenses, Fresnel lenses, optical disks with pregrooves, and the like includes heating a glass plate to a temperature higher than the softening point of the glass and then press-molding the glass using upper and lower dies. The upper die includes a base made of a hard metal and a work layer made of a noble metal alloy which has been sputtered on a press plane of the base through a mask. The mask has a fine aperture pattern such as a line and space pattern corresponding to the fine pattern of concavities and convexities which is to be formed at the surface of the glass optical element.

1 Claim, 6 Drawing Sheets

METHOD OF MANUFACTURING A DIE FOR USE IN MOLDING GLASS OPTICAL ELEMENTS HAVING A FINE PATTERN OF CONCAVITIES AND CONVEXITIES

BACKGROUND OF THE INVENTION

1. Field of the Invention

The present invention relates to a die for press-molding glass optical elements such as gratings, light wave guides, hologram pickups and the like, and a production method for manufacturing glass optical elements using the die.

2. Description of the Related Art

Conventionally, optical elements having fine concave and convex patterns are manufactured by working photosensitive resin plates, resin molding or dry-etching glass plates (See, for example, JP-A SHO 54-110857 and JP-A SHO 55-57807).

Gratings made of photosensitive resin are easy to manufacture but have a disadvantage in that accuracy of fine patterns becomes worsened by deformation due to environmental changes such as temperature, humidity and the like. Further, resin gratings are apt to become scratched since the hardness of resin is not so high. Thus, it is difficult to obtain resin gratings having high accuracy and reliability.

In contrast to resin gratings, glass gratings have advantages in that they have sufficient hardness and high reliability against environmental changes. However, it takes an extremely long time to manufacture glass gratings by dry-etching and, thus, it is difficult to mass-produce those having the same configuration.

SUMMARY OF THE INVENTION

An object of the present invention is to provide a method by which glass optical elements having high accuracy and reliability can be mass-produced.

Another object of the present invention is to provide a die for press-molding glass optical elements repeatedly for a long time.

A further object of the present invention is to provide a method for fabricating a die for press-molding glass optical elements.

In order to achieve these objects, according to the present invention, there is provided a method for manufacturing optical elements having a fine concave and convex pattern on a surface of each optical element comprising steps of preparing a die for press-molding said optical elements, said die having a work layer which is made of a noble metal alloy and forms a concave and convex pattern corresponding to concave and convex pattern of the optical element, setting a glass plate as the optical element between said die and a flat die, heating said glass plate up to a temperature higher than the softening point of glass, and press-molding said glass plate to form the fine concave and convex pattern on said glass plate.

The die for press-molding optical elements comprises a base made of a high strength and heat resistant material for forming a press plane; and a work layer formed on the press plane of said base which is made of a noble metal alloy and forms a concave and convex pattern corresponding to the concave and convex pattern of the optical element to be press-molded.

According to the present invention, there is further provided a method for fabricating a die for press-molding optical elements having a fine pattern of concavities and convexities on a surface of each optical element. The method includes preparing a base made of a high strength and heat resistant material, a surface of the base serving as a press plane, setting a mask above said press plane of said base, said mask having fine apertures corresponding to said fine pattern of concavities and convexities of said optical element, and depositing an alloy containing at least one of elements of the platinum group on said press plane of said base through said mask, thereby forming a concave and convex surface layer for press-molding the concavities and convexities of said optical element.

BRIEF DESCRIPTION OF THE DRAWINGS

These and other objects and features of the present invention will become clear from the following description of preferred embodiments thereof made with reference to the accompanying drawings throughout which like parts are indicated by like reference numerals, and in which.

DETAILED DESCRIPTION OF THE PREFERRED EMBODIMENTS

1st Preferred Embodiment

Figure 1:
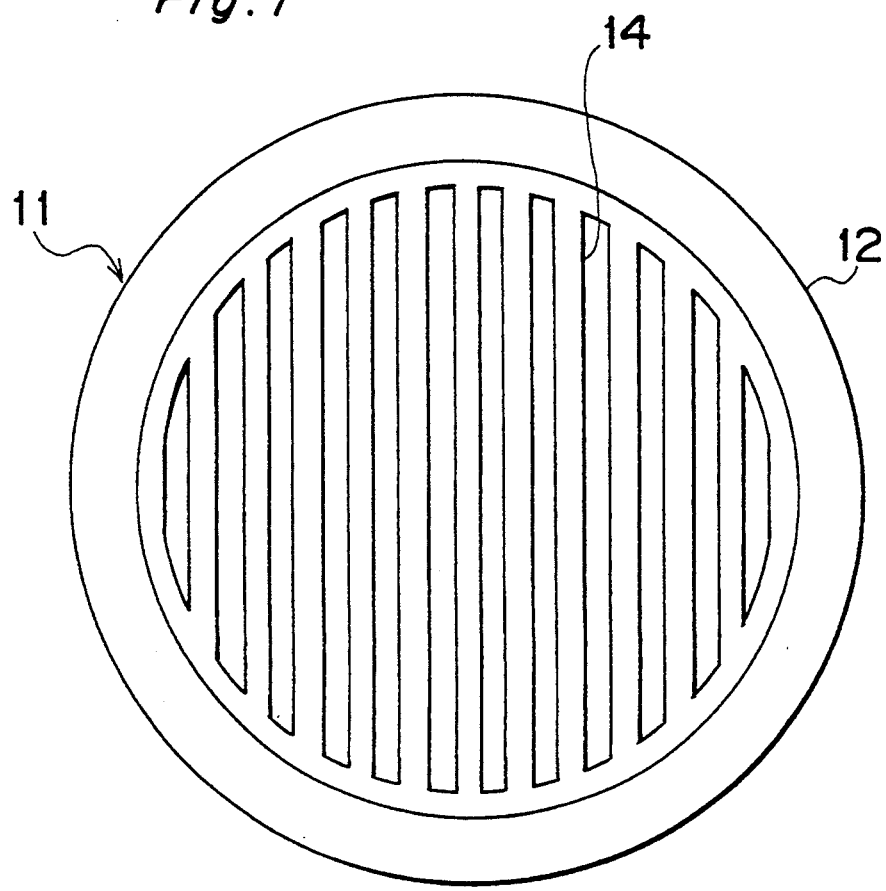
FIG. 1 is a plan view of a mask used for forming a die for press-molding optical elements according to the present invention.
Figure 2:
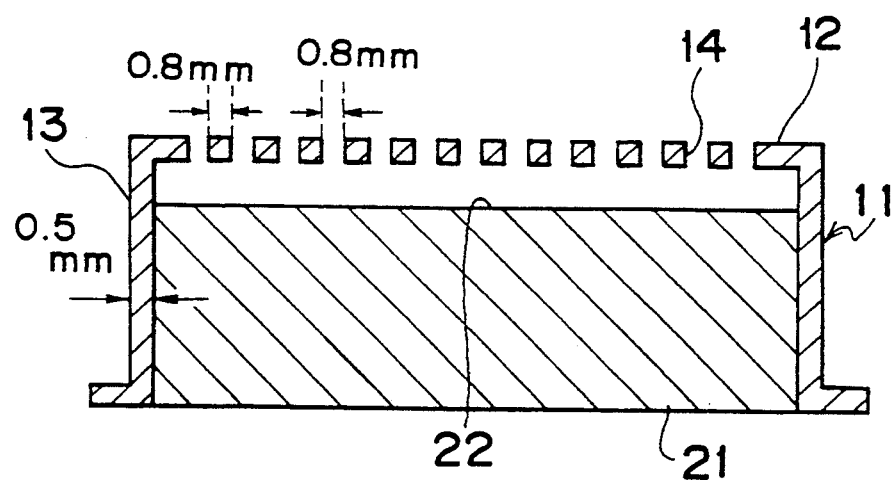
FIG. 2 is a cross-sectional view of the mask shown in FIG. 1.

FIG. 1 is a schematic plan view of a mask 11 used for fabricating a die for press-molding gratings and FIG. 2 is a cross-sectional view of the mask 11 set together with a base 21 for forming a die for press-molding gratings. The base 21 comprises a disk having a diameter of 20 mm and a thickness of 5 mm which is made of a cemented carbide (hard metal) containing tungsten carbide WC as a main component. The upper surface 22 of the base 21 is polished to a mirror finish so as to serve as a press plane, using super-fine abrasive grains of diamond.

The mask 11 comprises a circular mask 12 and a cylinder portion 13 having an inner diameter substantially equal to that of the base 21. The circular mask 12 has a thickness of 0.5 mm a so-called line and space pattern wherein fine linear slits 14 having a width of 0.8 mm are provided at an equal pitch of 1.6 mm.

In this example, the circular mask 12 is set 1 mm above the press plane 22 of the base 21 as supported on a bed of a sputtering apparatus (not shown). By sputtering Pt and Ir through the circular mask 12, a thin film 23 having a cross section of fine and regular pattern of concavities and convexities corresponding to the line and space pattern is deposited on the press plane 22 of the base 21.

Figure 3:
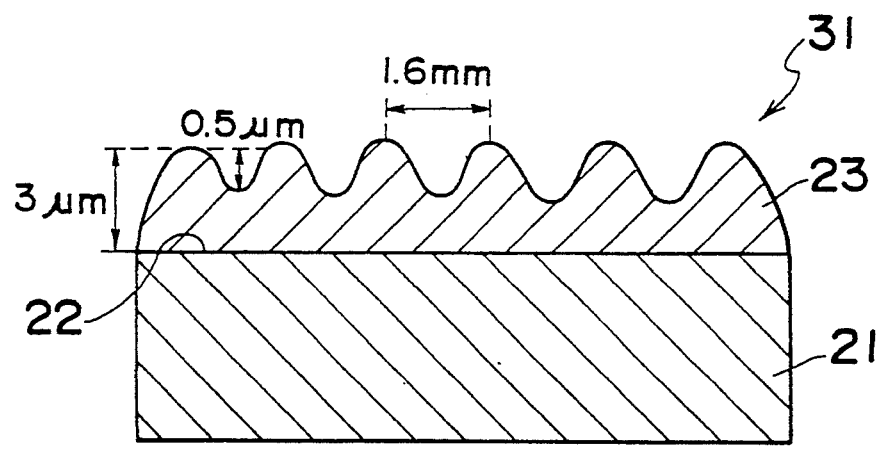
FIG. 3 is an enlarged cross-sectional view of the die showing a concave and convex pattern formed on a base material.

FIG. 3 is a schematic cross-sectional view of the die 31 thus fabricated by depositing the Pt-Ir thin film 23 on the press plane 22 of the base 21.

The Pt-Ir thin film 23 thus formed has a concave and convex pattern with a pitch of 1.6 mm in which heights of concave and convex portions are 2.5 $\mu$m and 3.0 $\mu$m, respectively.

Since the circular mask 12 was set apart from the press surface 22 of the base 21 in this example, sputtered particles came around respective spaces thereby forming a continuous and smooth concave and convex pattern. If the circular mask 12 were set on the press plane 22 of the base, no thin film is deposited under respective portions of the circular mask 12.

Further, it is to be noted that gratings having various grating patterns can be obtained by varying the pitch, widths of the slits of the mask, distance between the mask and the press plane, thickness of the mask, sputtering conditions, and so on.

Figure 4:
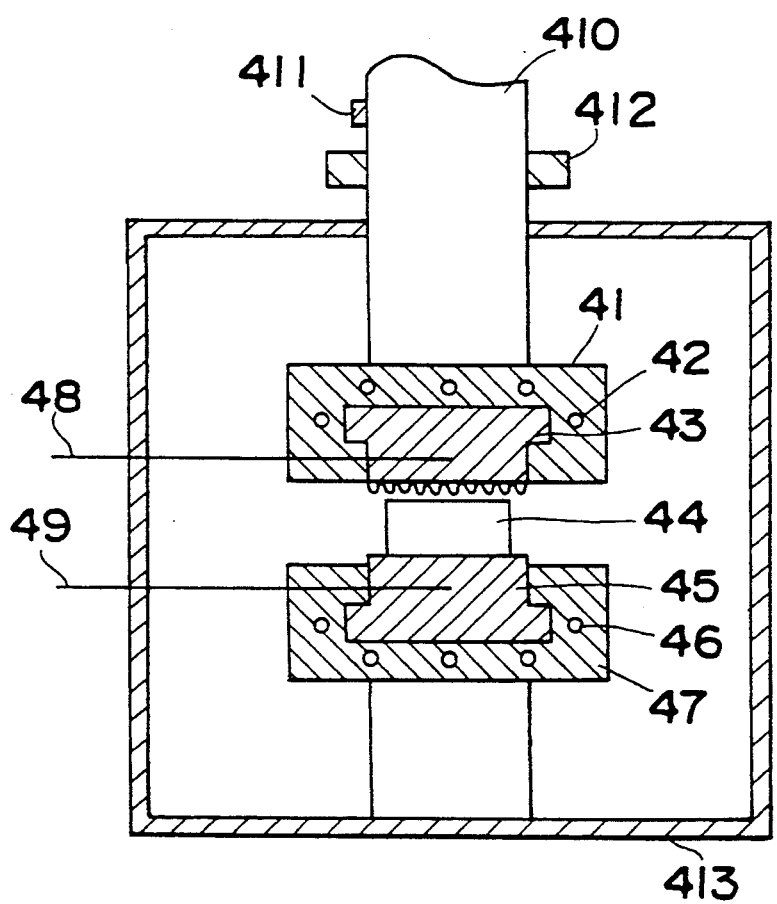
FIG. 4 is a schematic cross-sectional view of a press-molding machine according to the present invention.

As shown in FIG. 4, the die 31 serves as an upper die 43 in a press-molding apparatus. The press-molding apparatus provided with upper and lower holding blocks 41 and 47 for detachably holding upper and lower dies 43 and 45, upper and lower heaters 42 and 46 for heating the upper and lower dies 43 and 45, respectively, and a plunger 410 for pressing the upper die 43 via the upper holding block 41.

A glass plate 44 having a diameter of 20 mm and a thickness of 1 mm is set on the lower die 45 and heated to 500° C. (higher than a softening point of the glass) by the heat emitted from both heaters 42 and 46. When it is detected by upper and lower thermo-electric pairs 48 and 49 that the temperature of the glass plate 44 has been raised to 500° C., the plunger 410 is pushed down to press-mold the glass plate 44 with the upper die 43 until a position sensor 411 detects a stopper 412 by contacting the same. The press operation was carried out for two minutes with a press force of about 40 kg/cm² in a nitrogen atmosphere and, thereafter, the temperature of the die was lowered to 400° C. while maintaining other conditions as they were. Then, the glass plate press-molded as a grating was taken out from the press-molding apparatus.

After repeating this press-molding 10,000 times, the upper and lower dies 43 and 45 were detached from the press-molding machine to evaluate the accuracy of the die by observing the surface of the press plane of the die and measuring the roughness thereof (rms value, Å).

To obtain comparison data, there was provided a press-molding die made of SiC sintered material and the press-molding operation was repeated using the same press-molding machine. Table I shows results obtained.

TABLE I

| | Surface roughness before press operation (rms value, Å) | After 10,000 times press | |
|---|---|---|---|
| | | Surface roughness (Å) | Surface state |
| Die of the present invention | upper die 9.0 | 9.2 | good |
| | lower die 9.2 | 9.5 | good |
| Die of SiC sintered material | upper die 12.2 | impossible to measure | glass adhered |
| | lower die 11.8 | impossible to measure | glass adhered |

In the comparative example, glass was adhered to both surfaces of the upper and lower dies made of SiC sintered body when the press-molding operation was repeated 50 times and, it became impossible to continue the press-molding.

In contrast thereto, the surface of the upper die according to the present invention remained in a good state even after 10,000 press operations and the roughness thereof was unchanged.

Second Preferred Embodiment

Figure 5:
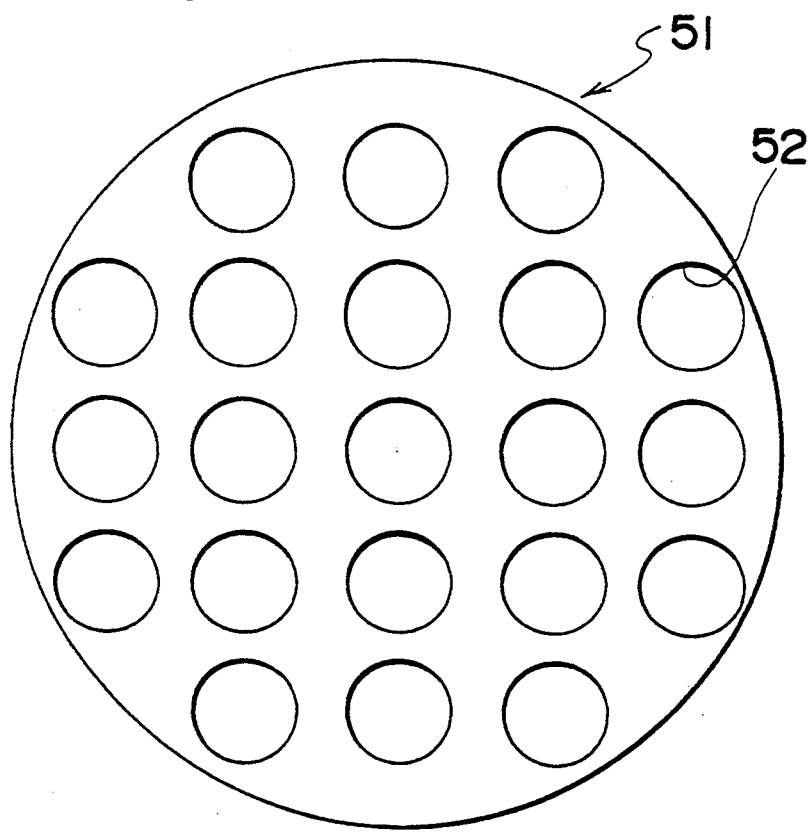
FIG. 5 is a plan view of a mask used for forming a die for press-molding microlenses.
Figure 6:
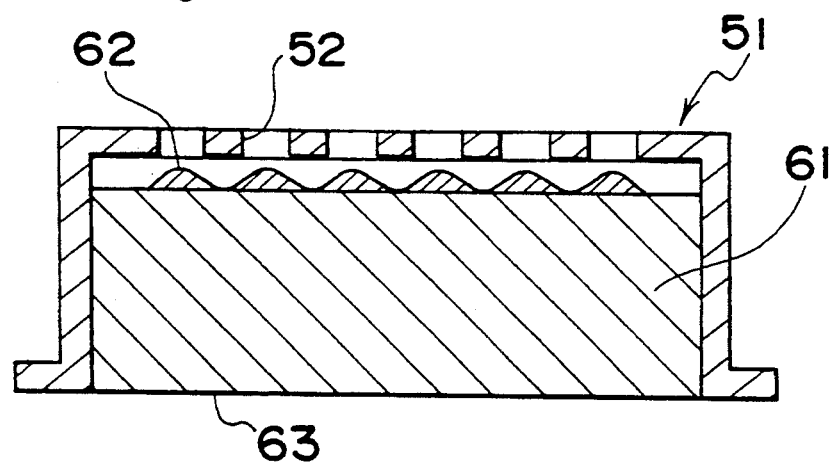
FIG. 6 is a cross-sectional view of the mask shown in FIG. 5.

FIG. 5 and FIG. 6 show a mask 51 for forming a die 61 to be used for press-molding microlenses.

The mask 51 has small circular apertures 52 arranged two-dimensionally at a small pitch.

By sputtering Pt and Ir using this mask 51, small convexities 62 are formed on a press plane of a base 63 made of a cemented carbide.

Using the die thus formed as an upper die, microlenses of glass can be fabricated easily and efficiently.

Third Preferred Embodiment

Figure 7:
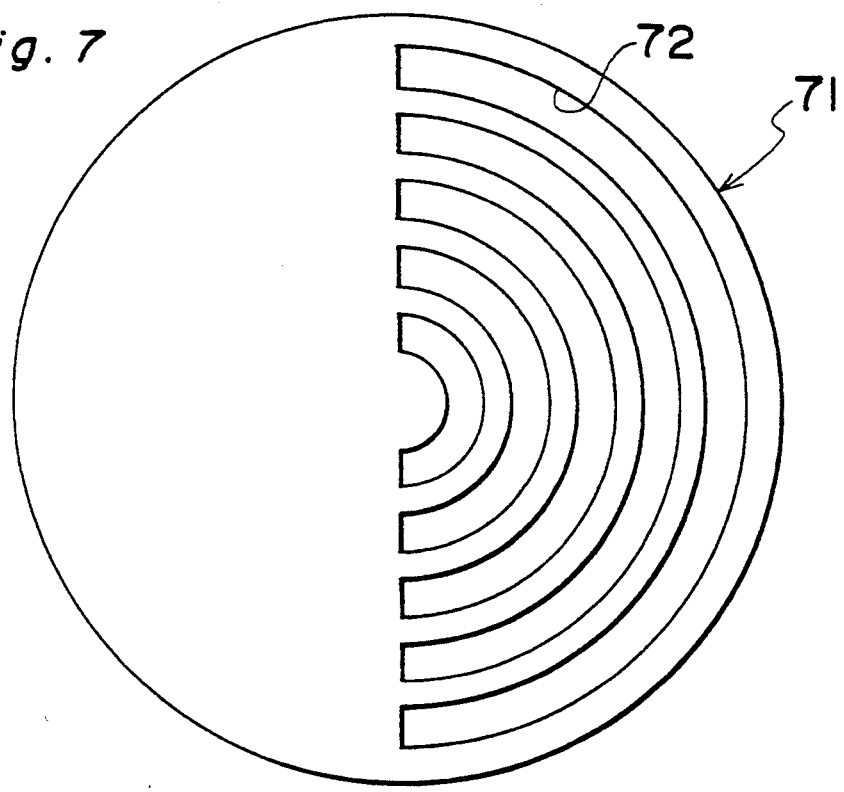
FIG. 7 is a plan view of a mask used for forming a die for press-molding Fresnel lenses.

FIG. 7 shows another example of the mask for forming a press-molding die for fabricating a Fresnel lens or an information memorizing base plate with pregrooves for a hard disk or photo-electric-magnetic disk.

As shown in FIG. 7, the mask 71 has a plurality of slits 72 having arcuate configurations concentric to a center of a circular plate. Each arcuate slit 72 subtends an angle of 180°.

Figure 8A:
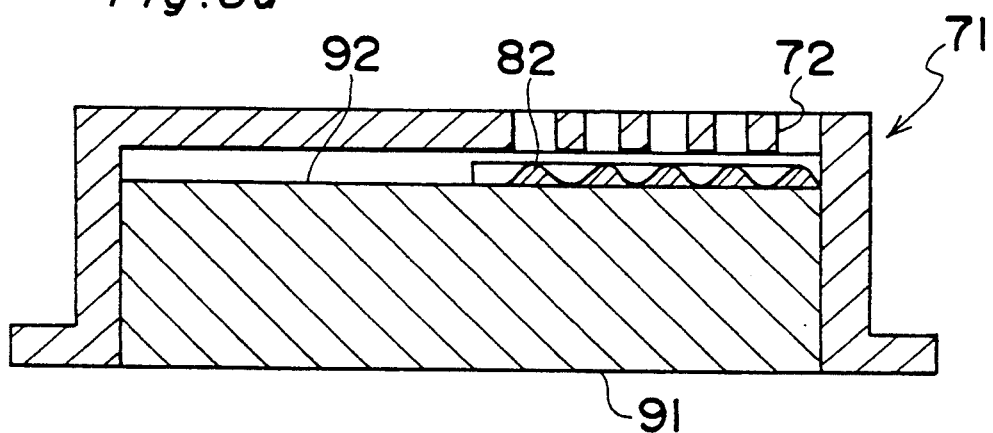
FIGS. 8a and 8b are cross-sectional of the mask of FIG. 7 showing a method for forming the die for press-molding Fresnel lenses, respectively.
Figure 8B:
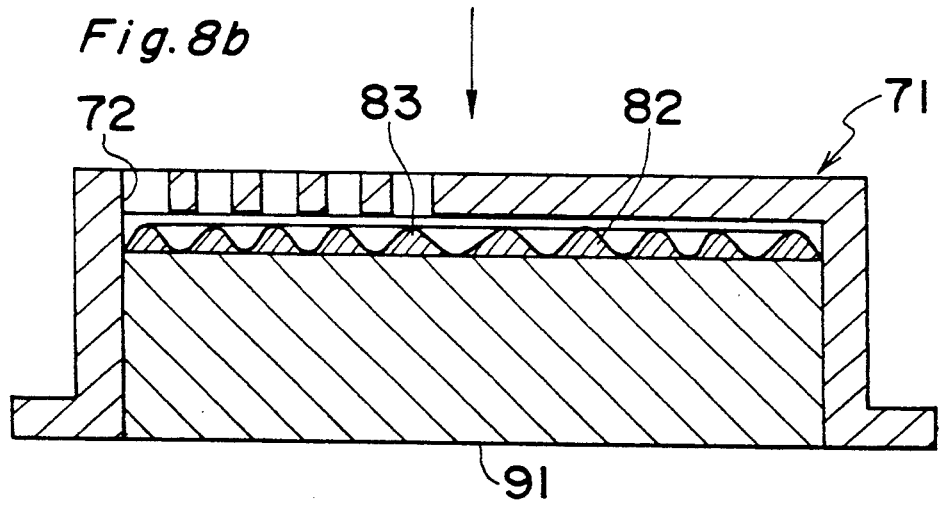

Upon forming a die for press-molding Fresnel lenses or base plates for disks as described above, as shown in FIG. 8a, a plurality of convex arcs 82 are formed on half of a press plane 92 of a base 91. Thereafter, the mask 81 is rotated about the center thereof by 180° and sputtering is performed again to form convex arcs 83 on the remaining half of the press plane 92 of the base 91. Thus, concentric convex rings are formed on the press plane. It is possible to press-mold glass elements having concentric circular grooves using the die thus formed as an upper die.

Fourth Preferred Embodiment

Figure 9A:
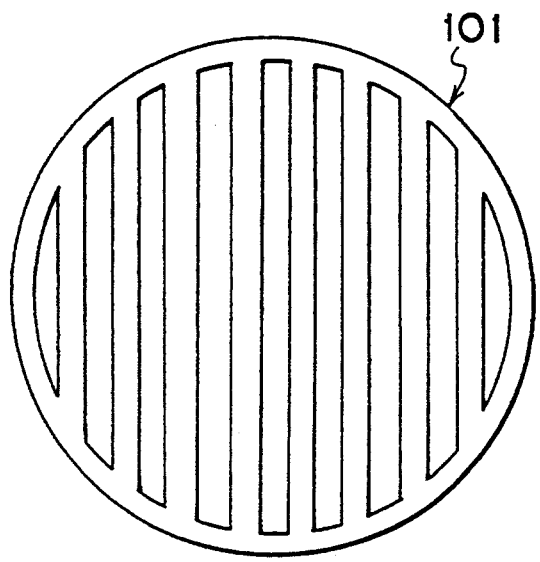
FIGS. 9a and 9b are plan views of first and second masks to be used in combination.
Figure 9B:
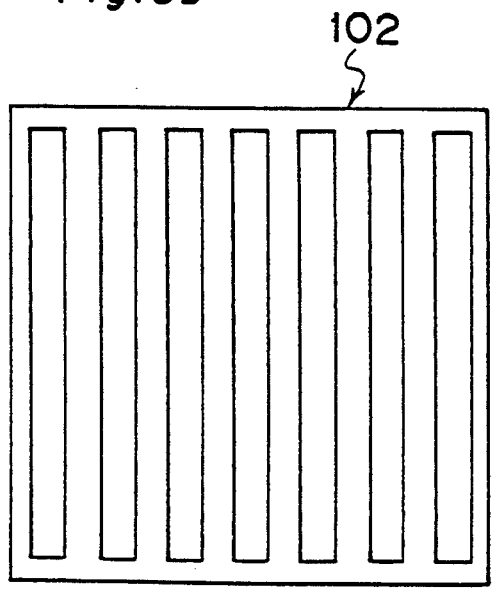
Figure 9C:
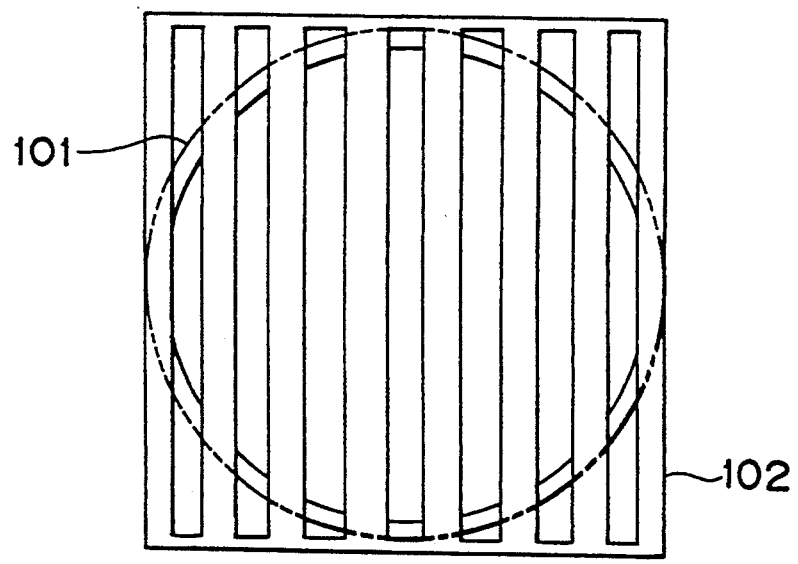
FIG. 9c is a plan view of the first and second masks stacked one on the other.

In this preferred embodiment, two masks 101 and 102 as shown in FIG. 9a and FIG. 9b are used for forming various concave and convex fine patterns.

The first mask 101 comprises a circular mask portion and has a line and space pattern similar to that of the mask shown in FIG. 1 and a cylindrical side wall portion having a diameter substantially equal to that of a base 103.

The second mask 102 is a square plate having a line and space pattern same as that of the first mask 101.

Figure 10A:
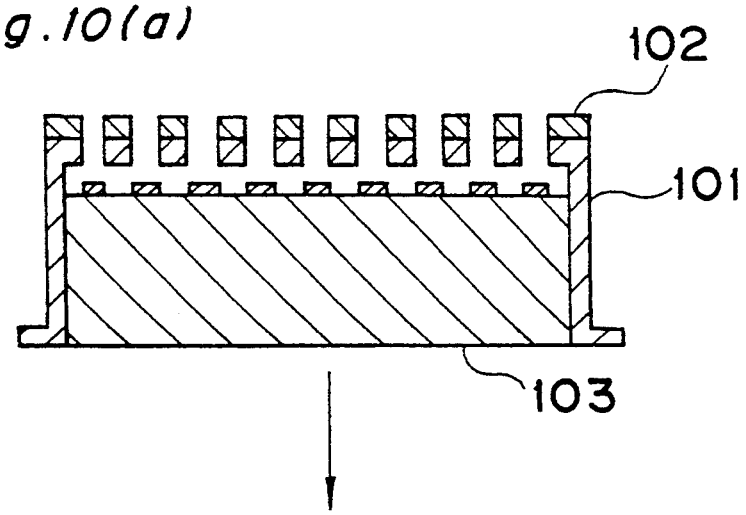
FIGS. 10a, 10b and 10c are cross-sectional views of the arrangement of FIG. 9c showing changes in deposition due to relative positioning of the first and second masks when stacked, respectively.
Figure 10B:
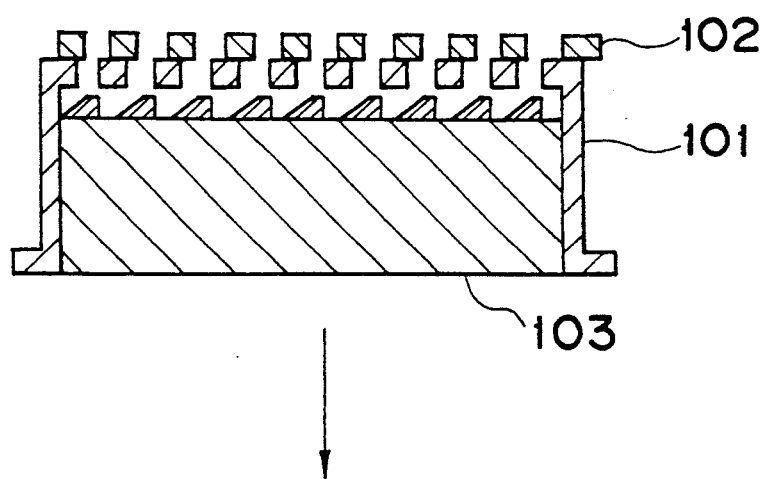
Figure 10C:
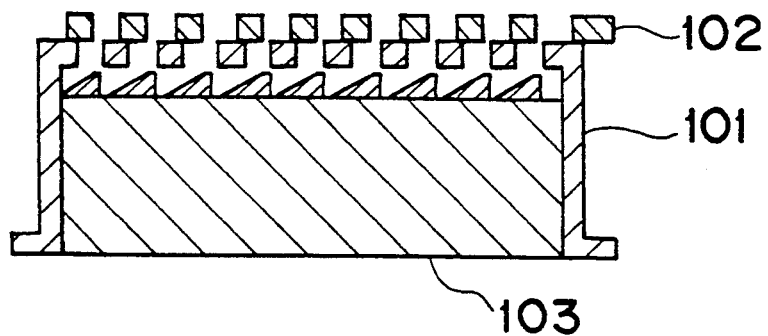

As shown in FIGS. 9c, 10a, 10b and 10c, the second mask 102 is stacked on the first mask 101 upon sputtering, and, by adjusting the position of the second mask 102 relative to the first mask 101, the cross-sectional configuration of the concave and convex pattern formed on the base can be varied as shown in FIGS. 10a, 10b, and 10c, respectively.

In other words, the second mask 102 has a role for changing flight paths of sputtered particles by changing the configuration of the aperture defined thereby.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they otherwise depart therefrom.

What is claimed is:

1. A method for fabricating a die for use in press-molding an optical element having a surface defining a fine pattern of concavities and convexities, said method comprising:

providing a base of a heat resistant material, an upper surface of said base constituting a press plane, setting a mask above said press plane of said base, said mask having fine apertures corresponding to the fine pattern of concavities and convexities at the surface of the optical element to be formed by the die, and depositing an alloy containing at least one element of the platinum group on said press plane of said base through said mask, thereby forming on said base a pattern of concavities and convexities to be used for press-molding the surface of the optical element.

* * * * *